(12) United States Patent
Hokenmaier et al.

(10) Patent No.: US 6,570,794 B1
(45) Date of Patent: May 27, 2003

(54) TWISTED BIT-LINE COMPENSATION FOR DRAM HAVING REDUNDANCY

(75) Inventors: Wolfgang Hokenmaier, Burlington, VT (US); Gunther Lehmann, Poughkeepsie, NY (US); Gerd Frankowsky, Hoehenkirchen-Siegertsbrunn (DE); David R. Hanson, Brewster, NY (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 10/034,626

(22) Filed: Dec. 27, 2001

(51) Int. Cl.[7] .................................................. G11C 7/00
(52) U.S. Cl. ........................ 365/200; 365/201; 365/63
(58) Field of Search ................................. 365/200, 201, 365/63

(56) References Cited

U.S. PATENT DOCUMENTS 5,331,601 A    7/1994   Parris
5,367,492 A  * 11/1994   Kawamoto et al. ......... 365/190
5,875,143 A    2/1999   Ben-Zvi
6,292,383 B1 * 9/2001   Worley ....................... 365/200

* cited by examiner

Primary Examiner—Huan Hoang
(74) Attorney, Agent, or Firm—Daly, Crowley & Mofford, LLP (57) ABSTRACT

A memory is provided having an array of rows and columns of memory cells. The memory includes plurality of sense amplifiers, each one having a true terminal and a compliment terminal. The memory also includes a plurality of pairs of twisted bit lines, each one of the pairs of lines being coupled to true and compliment terminals of a corresponding one of the plurality of sense amplifiers. A plurality of word lines is provided, each one being connected to a corresponding one of the rows of memory cells. An address logic section is fed by column address signals, fed to the bit lines, and row address signals, fed to the word lines, for producing invert/non-invert signals in accordance with the fed row and column address signals. The memory includes a plurality of inverters each one being coupled to a corresponding one of the sense amplifiers for inverting data fed to or read from the sense amplifier selectively in accordance with the invert/non-invert signals produced by the address logic.

7 Claims, 9 Drawing Sheets

Nop: No Operation
Act: Activate word line (row) in given bank
Write: Write data with column decoding to sense amplifiers in given bank
—: Don't Care RA,RB: Row address of bank A, bank B
CA,CB: Column address of bank A, bank B
BA,BA: Bank address A, bank address B $T_A$ : Store row address RA of bank BA in descrambling circuit
$T_B$ : Store row address RB of bank BB in descrambling circuit
$T_C$ : Execute descrambling operation with BA, RA, and CA as input
$T_D$ : Execute descrambling operation with BB, RB, and CB as input

TWISTED BIT-LINE COMPENSATION FOR DRAM HAVING REDUNDANCY

TECHNICAL FIELD

This invention relates to semiconductor memories and more particularly to semiconductor memories having twisted bit lines.

BACKGROUND

Figure 1:
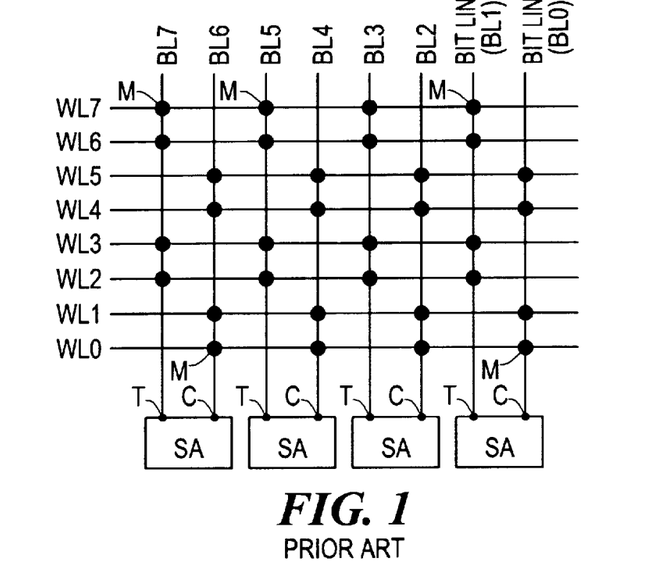
FIG. 1 is a block diagram of a DRAM according to the prior art.

As is known in the art, semiconductor memories include a matrix of rows and columns of storage cells (M), such cells being coupled to rows of word lines (WL) and columns of bit lines (BL). One arrangement is shown in FIG. 1. Here, the first two word lines (i.e., WL0 and WL1) connect the memory cells M to the compliment terminals C of the sense amplifiers SA and the next two word lines WL2, WL3 couple the memory cells M to the true terminals T of the sense amplifiers, and so on as the process repeats as shown. Such an arrangement requires some data de-scrambling during testing of the array. More particularly, while during normal operation, storage of a bit of data in any cell will be retrieved properly without concern as to whether the cell is coupled to the true (T) or compliment (C) terminals of the sense amplifier (SA), such is of concern during testing of the cells. For example, with a DRAM array, one test is performed where all the cells are stored with a charge corresponding to one logic state (i.e., a logic 1). To test whether the cell is storing such charge the logic state of the cells is detected with the sense amplifier. Thus, it is necessary to de-scramble the data produced by the sense amplifiers. Here, for example, when the memory cells addressed by word line WL0 are read by the sense amplifiers SA, the logic states provided at the output of the sense amplifiers in the logic are complimentary to the logic states read from the memory cells addressed by the word line WL2. The requisite de-scrambling is relatively simple in this arrangement because the complement/true condition is known by merely knowing the word line addressing the memory cells.

Figure 2:
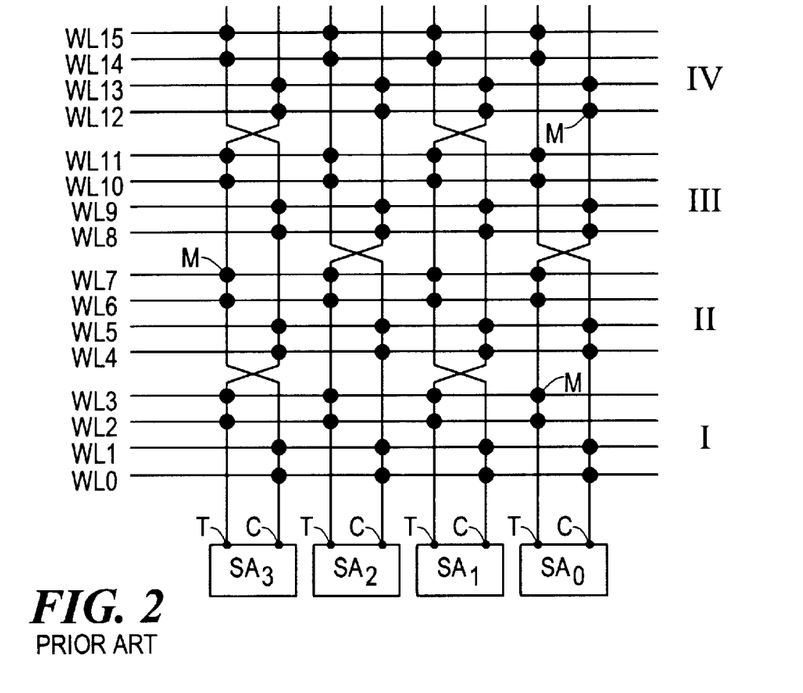
FIG. 2 is a block diagram of a DRAM having twisted bit lines according to the prior art.

As is also known in the art, twisted bit-lines are used because they are less sensitive to noise and bit-line coupling. One such arrangement is shown in FIG. 2. Twist means that at a certain point in the memory array the sense amplifiers true T and compliment C terminals are swapped. Thus, as shown in FIG. 2, there are shown four regions I, II, III, and IV of a portion of the memory array. Each region has the same arrangement as the entire array shown and described above in connection with FIG. 1. However, in coupling Region I to Region II, there are bit line reversals coupled to sense amplifiers SA1 and SA3. On the other hand, in coupling Region II to Region III, there are bit line reversals coupled to sense amplifiers SA0 and SA2. The sequence repeats in coupling between Regions III and IV and from Region IV to V (not shown). The following should also be noted: Common for Regions I and III is that a word line connects the memory cells either to a true or a compliment bit line. This is different in the regions II and IV where a word line connects memory cells alternating to true and compliment bit lines. Thus, while with word line W0, for example, the memory cells are coupled to the compliment input, for word line W4 the pattern alternates between true and compliment inputs.

To put it another way, FIG. 2 shows three twist regions running parallel to the word lines. The first bit lines connected to the first sense amplifier are twisted twice, the bit lines connected to the second sense amplifier are twisted once, and so on. This breaks the array into four different Regions I–IV in the terms of physical data scrambling. Region I (i.e., word lines WL0–WL3 shows the same physical scrambling as that in FIG. 1. In Region III (i.e., word lines WL8–WL11), the physical scrambling is inverted, which means that all true and lines are swapped. Common for regions I and III is that a word line connects the memory cells either to a true or compliment bit line. This is different in the Regions II and IV. Here, a word line connects memory cells alternating to true and bit lines. It is noted that the relation between the column address and the row address for a physical data pattern is complex.

In any event, de-scrambling of the data for the arrangement shown in FIG. 2 is more complex that that required for the arrangement shown in FIG. 1.

Figure 3:
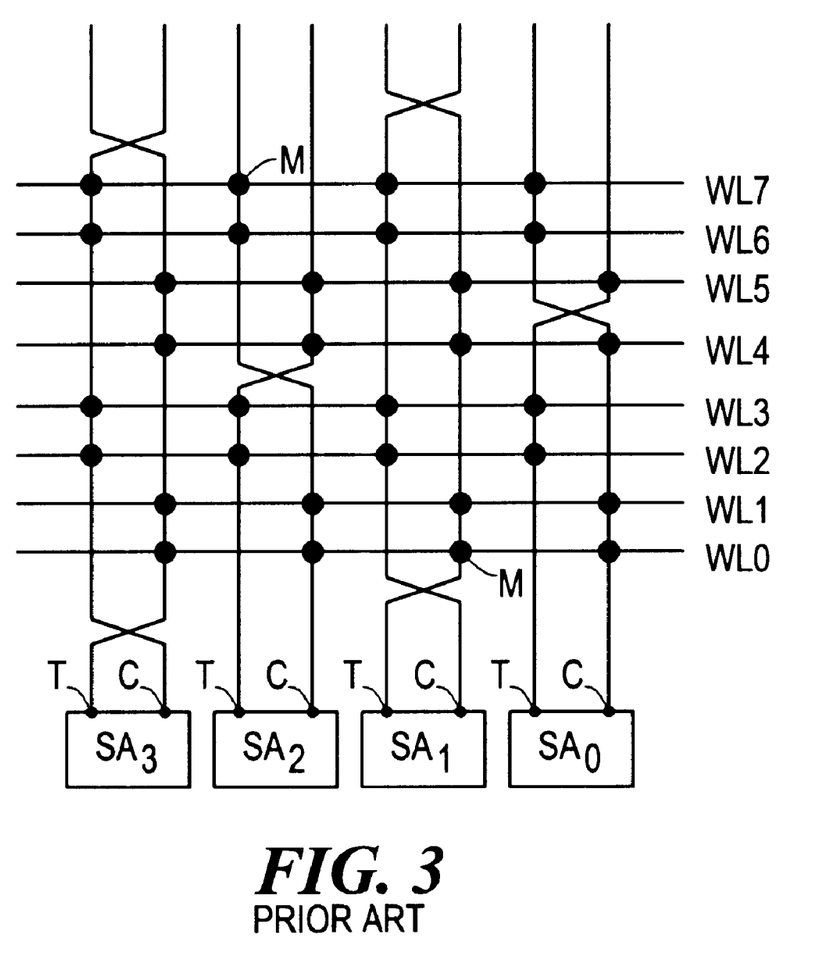
FIG. 3 is a layout diagram of a DRAM having twisted bit lines according to the prior art.

Referring now to FIG. 3 another arrangement for a twisted bit line array is shown. Such an arrangement is used whether layout consideration prohibit the layout shown in FIG. 2; (i.e., where there is space available for only one "twist" in any one row of the array). This arrangement is sometimes referred to as a diagonal interleaved twisted bit-line structure. Here the data de-scrambling is even more complex.

SUMMARY

In accordance with the present invention, a memory is provided having an array of rows and columns of memory cells. The memory includes plurality of sense amplifiers, each one having a true terminal and a compliment terminal. The memory also includes a plurality of pairs of twisted bit lines, each one of the pairs of lines being coupled to true and compliment terminals of a corresponding one of the plurality of sense amplifiers. A plurality of word lines is provided, each one being connected to a corresponding one of the rows of memory cells. An address logic section is fed by column address signals, fed to the bit lines, and row address signals, fed to the word lines, for producing invert/non-invert signals in accordance with the fed row and column address signals. The memory includes a plurality of inverters each one being coupled to a corresponding one of the sense amplifiers for inverting data fed to or read from the sense amplifier selectively in accordance with the invert/non-invert signals produced by the address logic.

In accordance with another embodiment of the invention, a memory is provided having an array of rows and columns of memory cells. A plurality of sense amplifiers, each one having a true terminal and a compliment terminal, is included. A plurality of pairs of bit lines is included, each one of the pairs of lines being coupled a corresponding one of the plurality of sense amplifiers. One of the bit lines in the pair is connected to a first portion of the memory cells in a first one of the columns of such cells and to a first portion of the memory cells in a second one of the columns of the memory cells. The other one of the bits lines in the pair is connected to a second portion of the memory cells in the first one of the columns of such memory cells and to a second portion of the memory cells in the second one of the columns of the memory cells. One of the lines in each pair of bit lines is coupled to the true terminal of the coupled one of the sense amplifiers and the other one of the lines of such pair of lines is coupled to the compliment terminal of the coupled one of the sense amplifiers. A plurality of word lines is included, each one being connected to a corresponding one of the rows of memory cells. An address logic section is fed by column address signals fed to the bit lines and row address signals coupled to the word lines for producing invert/non-invert signals in accordance with the fed row and column address signals. A plurality of inverters is included each one is coupled to a corresponding one of the sense amplifiers for inverting data fed to or read from the sense amplifier selectively in accordance with the invert/non-invert signals produced by the address logic.

In one embodiment, each one of the memory cells in one of the rows thereof is coupled is the true terminal of the plurality of sense amplifiers and each one the memory cells in another one of the rows thereof is coupled is the compliment terminal of the plurality of sense amplifiers.

In one embodiment, one portion of the memory cells in one of the rows thereof is coupled is the true terminal of one of the plurality of sense amplifiers and another portion of the memory cells in such one of the rows thereof is coupled is the compliment terminals of another one of the plurality of sense amplifiers.

In one embodiment, adjacent ones of the memory cells in such one of the rows are the connected to the true and compliment terminals of a corresponding pair of the sense amplifiers, respectively.

In one embodiment, the address logic section is enabled in response to a test signal and wherein when such test signal is applied to the address logic the memory cells in the array are programmed to bits of data having the same logic state.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 4:
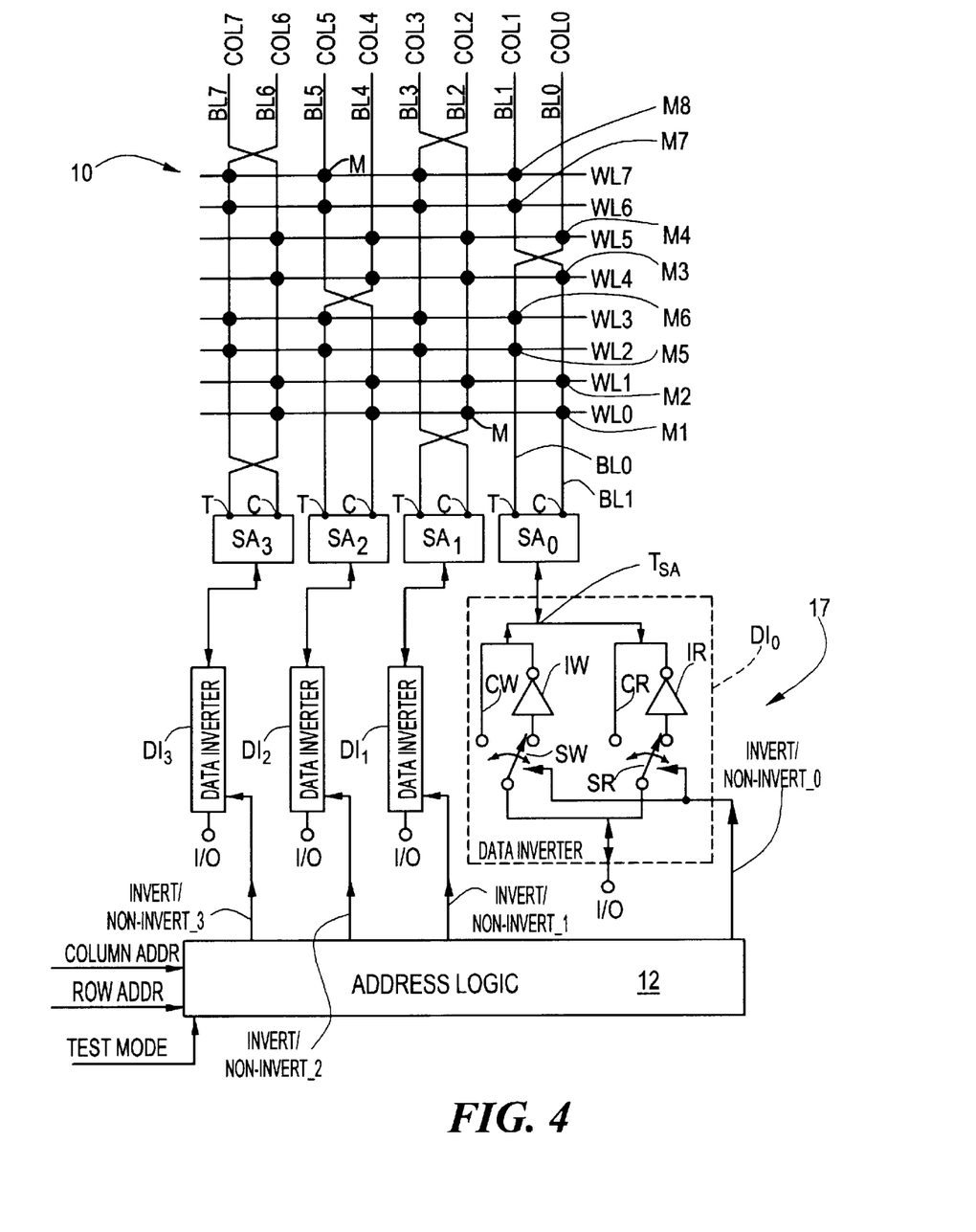
FIG. 4 is a block diagram of a DRAM of FIG. 3 having twisted bit lines and a de-scrambling circuit according to the invention.

Referring now to FIG. 4, a memory 10 is shown to include an array of rows and columns of memory cells, M, here DRAM cells. A plurality of sense amplifiers SA0–SA3, it being understood that more sense amplifiers would be included, only a portion, here four, being shown for simplicity in understanding the invention.

Each one of the sense amplifiers SA0–SA3 having a true terminal T and a compliment terminal C, is included.

The columns of memory cells M are connected to word lines WL0–WL7, it being understood that more word lines would be included, only a portion, here eight, being shown for simplicity in understanding the invention. There is a plurality of pairs of bit lines (i.e., bit line pairs BL0, BL1; BL2, BL3; BL4, BL6; BL6, BL7; etc.). It is noted that each one of the pairs of bit lines is coupled a corresponding one of the plurality of sense amplifiers (i.e., sense amplifiers SA0; SA1; SA2; SA3; etc., respectively as shown). It is also noted that there are a plurality of columns COL0, COL1, COL2, COL3, . . . of memory cells, M.

Considering an exemplary one of the pairs of the columns of memory cells, here the pair of columns COL0 and COL1, COL0 has memory cells M1, M2, M3 and M4 while COL1 has memory cells M5, M6, M7 and M8, as indicated. Considering an exemplary on of the plurality of pairs of bit lines, here pair BL0 and BL1, bit line BL0 is connected to memory cell M4, which is in column COL0, and to memory cells M5 and 6 which are in column COL1, while bit line BL1 is connected to memory cells M7 and M8 which are in column COL1 and to memory cells M1, M2 and M3 which are in column COL0. Thus, one of the bit lines in the pair is connected to a first portion of the memory cells in a first one of the columns of such cells and to a first portion of the memory cells in a second one of the columns of the memory cells while the other one of the bits lines in the pair is connected to a second portion of the memory cells in the first one of the columns of such memory cells and to a second portion of the memory cells in the second one of the columns of the memory cells.

Further, one of the lines in each pair of bit lines is coupled to the true terminal T of the coupled one of the sense amplifiers and the other one of the lines of such pair of lines is coupled to the compliment terminal C of the coupled one of the sense amplifiers. Thus, considering the pair of bit lines BL0 and BL1, bit line BL0 is connected to the true terminal T of sense amplifier SA0 and the bit line BL1 is connected to the compliment terminal C of such sense amplifier SA0.

A plurality of word lines WL is included, here only word lines WL0–WL7 being shown, it being understood that more word lines would be included, only a portion, here eight being shown for simplicity in understanding the invention. Each one of the word lines WL0–WL7 is connected to a corresponding one of the rows of memory cells M.

A de-scrambling circuit 17 is included. The de-scrambling circuit 17 includes: a plurality of data inverters DI0–DI3, each one being coupled to a corresponding one of the sense amplifiers SA0–SA3, respectively, as indicated; and, an address logic 12. Each one of the data inverters DI0–DI3 is identical in construction, an exemplary one thereof, here data inverter DI0 being shown in detail to include a pair of switches SR and SW as shown. The data inverter DI0 includes a terminal TSA coupled to the sense amplifier SA0 and an input output terminal I/O, as indicated. The data inverter DI0 also includes a pair of inverters, IR, IW, as indicated.

The address logic section 12 is fed by column address signals (COLUMN ADR) fed to the bit lines BL and row address signals (ROW ADR) coupled to the word lines WL for producing invert/non-invert signals in accordance with the fed row and column address signals ROW ADR and COLUMN ADR, respectively).

During the write portion of a test mode, if there is to be an inversion in the data passing from the I/O terminal to the sense amplifier SA0, the write switch SW couples the terminal I/O to the sense amplifier SA0 through the write inverter IW. On the other hand, if there is to be no inversion in the data passing from the I/O terminal to the sense amplifier SA0, the write switch SW couples the terminal I/O directly to the sense amplifier SA0 through connector CW. The invert/non-invert operation of the write and read switches SW. SR is in accordance with the binary signal produced by the address logic on line INVERT/NON-INVERT_0 fed to the data inverter DI0. It is noted that the address logic 12 produces signals on each of a plurality of lines INVERT/NON-INVERT_0 through INVERT/NON-INVERT_3, each lines INVERT/NON-INVERT_0 through INVERT/NON-INVERT_3 being coupled to a corresponding one of the data inverters DI0–DI3, respectively as shown.

During a subsequent read write portion of a test mode, if there is to be an inversion in the data passing from the sense amplifier SA0 to the terminal I/O, the read switch SR couples the sense amplifier SA0 to the terminal through the read inverter IR. On the other hand, if there is to be no inversion in the data passing from the sense amplifier SA0 to the I/O terminal, the read switch SR couples the sense amplifier SA0 to the terminal I/O directly to the through connector CR.

The address logic 12 stores the relationship between the row address and column address signals and the INVERT/NON-INVERT signals, INVERT/NON-INVERT_0 through INVERT/NON-INVERT_3 as follows:
I=Invert, NI=Keep (non invert)
CA=Column Address
RA=Row Address WLR. As a consequence, the activation of word line 11 would result in the activation of the redundant word line. This however leads to a different data scrambling, since the WLR is located in region IV, whereas the replaced word line, here WL11, is located in region III. A similar situation might be present in case of bit line replacements. Further, such may occur in the array shown in FIG. 3.

Figure 5:
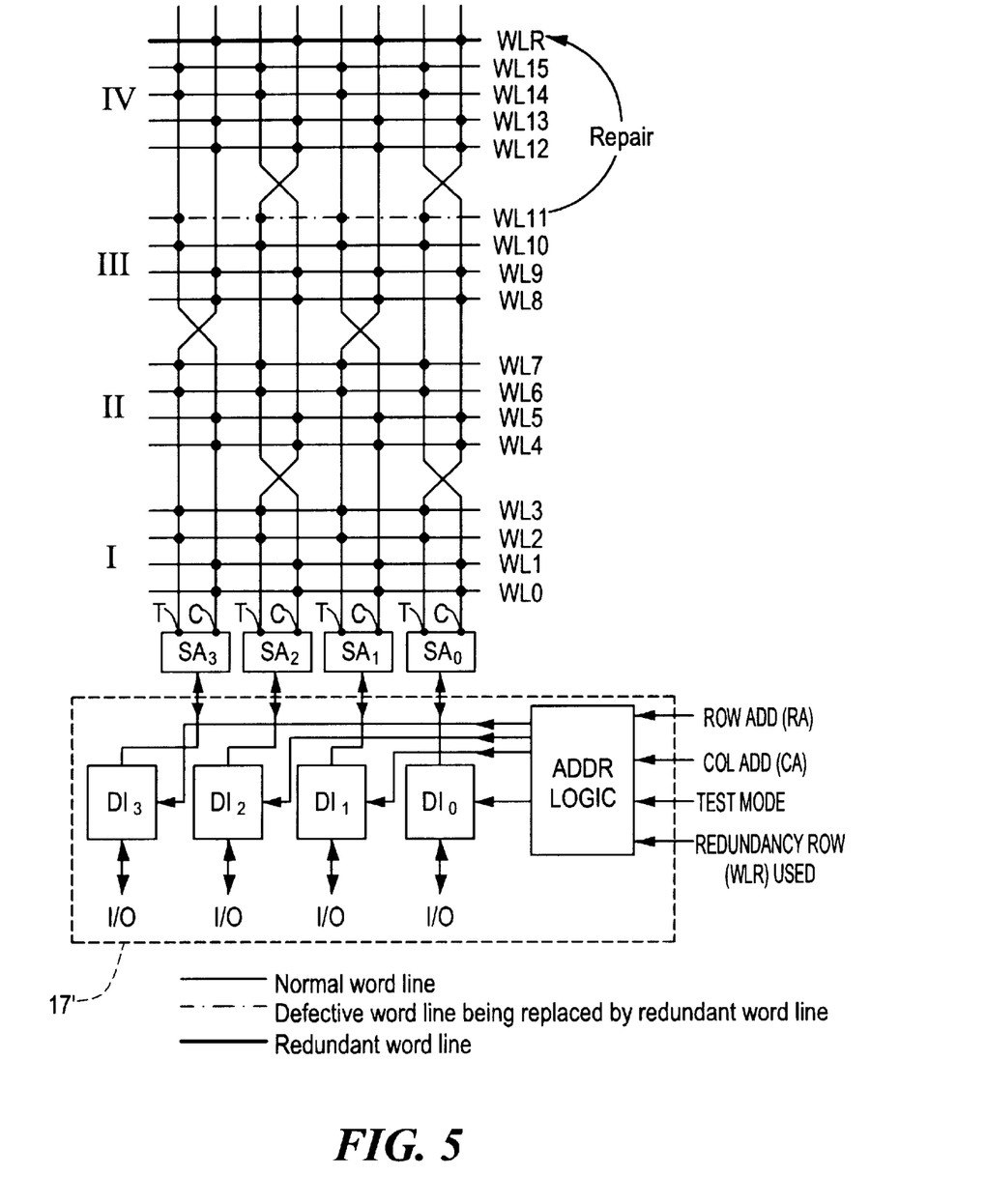
FIG. 5 is a block diagram of a DRAM having twisted bit lines according to FIG. 2 with a redundant row and with a de-scrambling circuit according to the invention.

Therefore, the de-scrambling circuit 17' in this embodiment, has an additional input "REDUNDANCY ROW (WLR) USED", as indicated, that allow the de-scrambling circuit 17; to adjust to any repairs in the word line (or bit line) direction.

Figure 6:
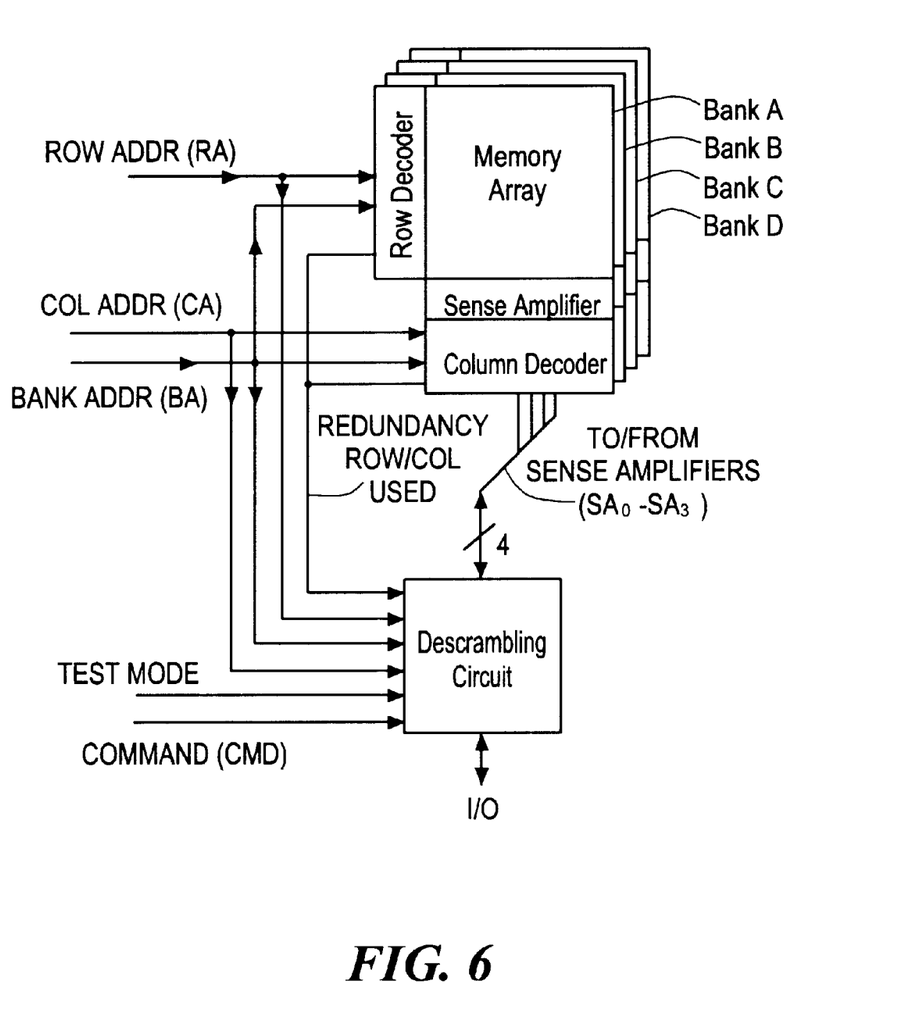
FIG. 6 is a block diagram of a DRAM having a bank of memory arrays, such arrays having twisted bit lines and adapted to have redundant word lines and columns (i.e., bit lines), such DRAM having a de-scrambling circuit according to the invention.

Referring now to FIG. 6, such FIG. 6 shows the de-scrambling circuit 17' integrated into a multi bank DRAM circuit. Here there are illustrated only four banks, BANK A, BANK B., BANK C and BANK D. The input to the de-scrambling circuit 17' are the different parts of the address, namely the bank address (BA), the row address (RA) and the column address (CA). Generally, it would not be necessary to consider the bank address since it can be assumed that the different memory banks are identical with respect to data scrambling. However, multi-banking allows activation of up to one word line in each bank. The word lines (WL) being active can be located in different data scrambling regions. Therefore, the de-scrambling circuit 17 keeps track of the bank address (BA) also, as will be described in more detail below in connection with FIGS. 7 and 8.

Suffice it to say here that beside the addresses (BA, CA, RA), the de-scrambling circuit 17' receives user command signals (CMD, e.g., Read data, Write data, Power Down, etc.) which indicate when a de-scrambling operation has to be performed. Generally, the de-scrambling circuit 17 is active during a column operation, i.e. a data read from a column or a data write to a column. The de-scrambling

|       |       |       |      | SA 0 |    | SA 1 |    | SA2 |    | SA3 |    |
|-------|-------|-------|------|------|----|------|----|-----|----|-----|----|
|       |       |       | CA<1> | 0   |    |      |    | 1   |    |     |    |
|       |       |       | CA<0> | 0   |    | 1    |    | 0   |    | 1   |    |
| RA<2> | RA<1> | RA<0> | COL  | 0    | 1  | 2    | 3  | 4   | 5  | 6   | 7  |
| 1     | 1     | 1     | WL 7 | I    |    | I    |    | I   |    | I   |    |
| 1     | 1     | 0     | WL 6 | I    |    | I    |    | I   |    | I   |    |
| 1     | 0     | 1     | WL 5 | NI   |    | NI   |    | NI  |    | NI  |    |
| 1     | 0     | 0     | WL 4 | I    |    | NI   |    | NI  |    | NI  |    |
| 0     | 1     | 1     | WL 3 |      | NI |      | I  |     | NI |     | I  |
| 0     | 1     | 0     | WL 2 |      | NI |      | I  |     | NI |     | I  |
| 0     | 0     | 1     | WL 1 | I    |    | NI   |    | I   |    | NI  |    |
| 0     | 0     | 0     | WL 0 | I    |    | NI   |    | I   |    | NI  |    |

Example of address logic for SA0 (CA<0>=0, CA<1>=0):
InvertSA0=[(RA<2>) AND (RA<1>)] OR
[(RA<2>) AND (NOT RA<0>)] OR
[(NOT RA<2>) AND (NOT RA<1>)].

Referring now to FIG. 5, another example of a data scrambling situation is shown. Here, the scrambling is identical to the example shown in FIG. 2, However, one more row (or word line), here a word line WLR, has been added to the memory array. Generally, those additional word lines are so-called redundant word lines being used as replacements for defective word lines. FIG. 5 illustrates an example where word line WL11 is replaced with the redundant word line WLR. Such replacement is typically done after a test reveals that there is a fault in a memory cell M in the word line WL11, for example. When such a fault is detected, fusible links, not shown, are programmed to electrically de-couple the defective word line, here word line WL11, and in effect replace it with the redundant word line circuit 17 is located close to the data I/Os, as indicated. A single de-scrambling circuit 17' is shared between the memory banks, as indicated. Therefore, the area penalty for this circuit 17' becomes very small. The number of data lines that have to be controlled in this implementation is small due to the closeness to the I/Os. Currently sold commodity DRAMs have either 4, 8 or 16 I/O lines. This number compares to a much bigger number of sense amplifier data lines, a typical number is 2048. Therefore, it is preferable to implement the de-scrambling circuit 17' close to the data I/O lines instead having a multitude of de-scrambling circuits in each memory array bank.

Figure 7:
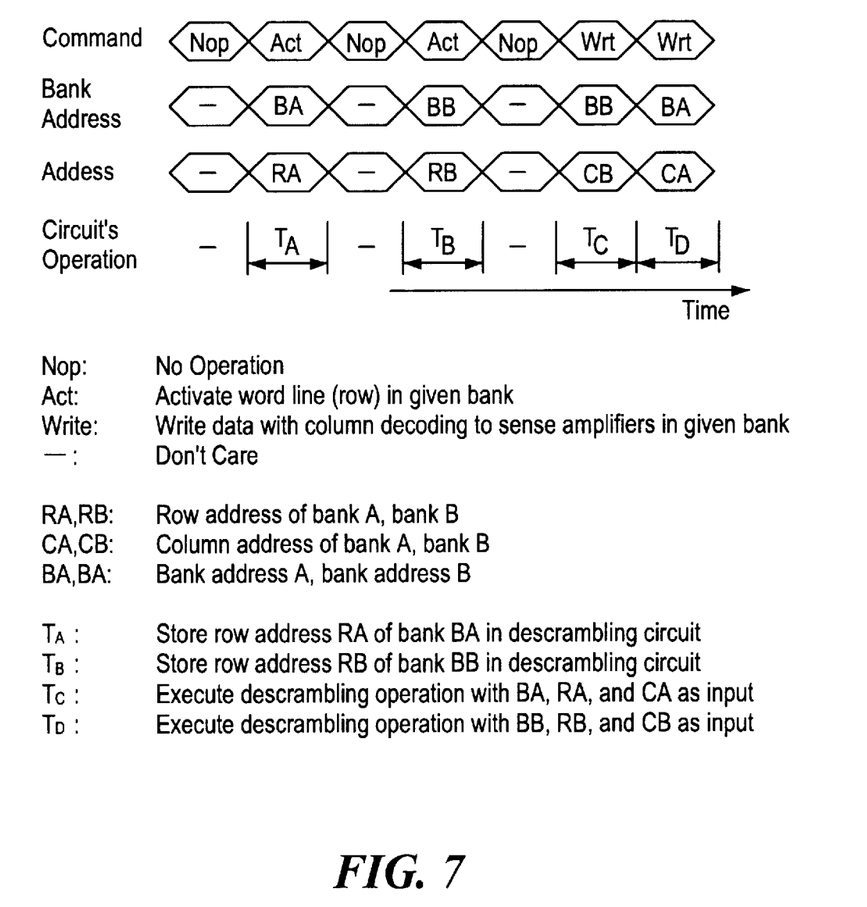
FIG. 7 is a timing diagram useful in understanding the DRAM of FIG. 6.
Figure 8:
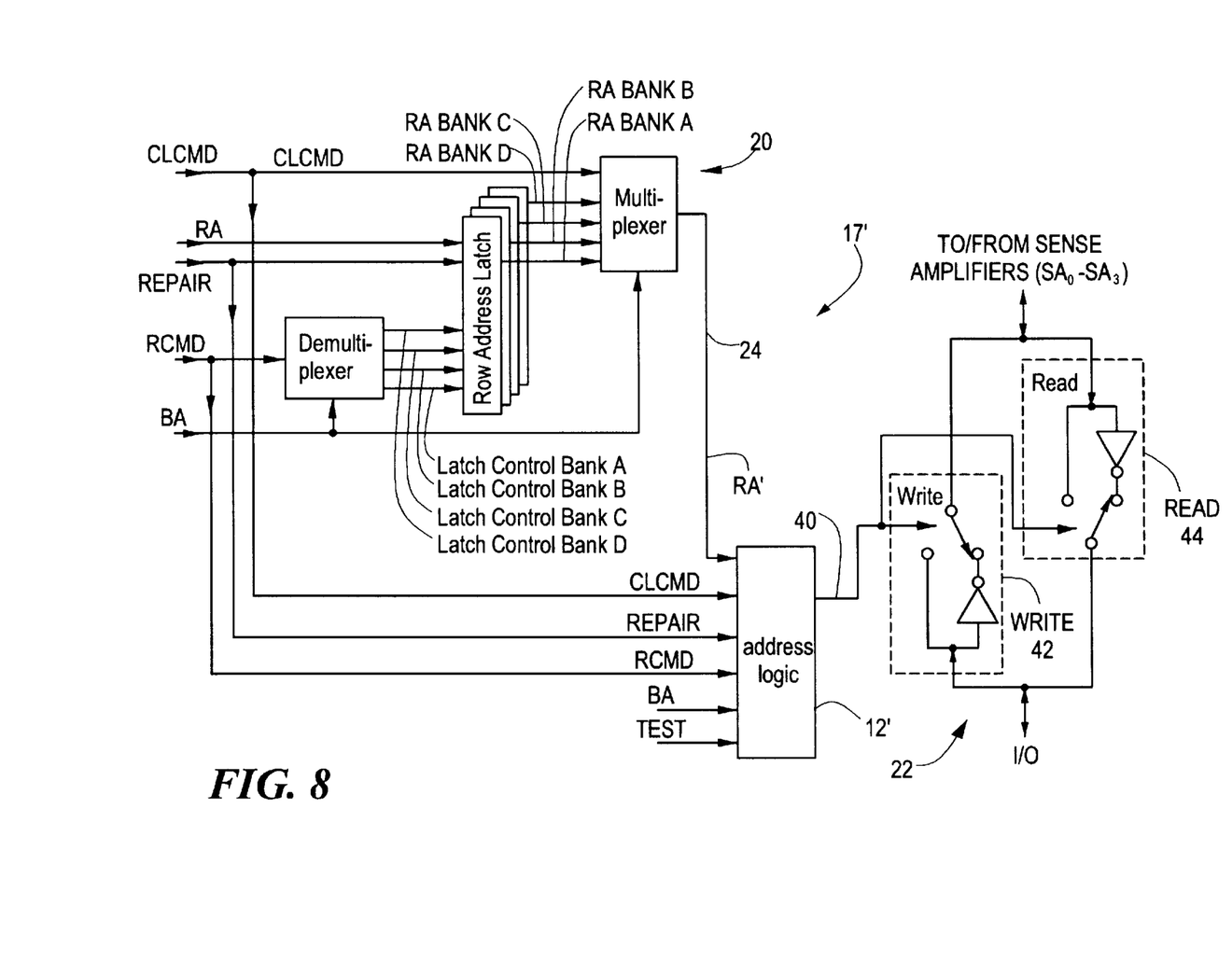
FIG. 8 is a more detailed block diagram of the de-scrambling circuit of FIG. 6.

Referring now to FIGS. 7 and 8, FIG. 7 shows an example of waveforms at the interface of a multi bank DRAM circuit. This example illustrates why the data scrambling circuit 17' has to track the currently active row address (RA) for each memory bank. The no operation commands (Nop) shown here are not relevant. They are just used to make it easier to relate this example to commonly used DRAM interface specifications, like PC-100. First, the word line with the row address RA is activated in BANK A (bank BA). Next, the word line RB is activated in BANK B (bank BB). Then, a write command is issued to column CB in bank BB, followed by a write command to column CA in bank BA. At this point, it should be noted, that the row address is not present when the column commands are issued. This limitation is caused by the fact that commonly the address bus is shared between row addresses and column addresses. Data scrambling however depends on the row address if bit line twisting is applied. Therefore, the de-scrambling circuit 17 provides an internal storage mechanism, here row address generator 20. for the currently active row address of each bank (FIG. 8).

Referring to FIG. 8, the storage function latches the row address (RA) upon a word line activate command (RCMD) for upcoming column commands (read or write) to a particular bank. When a column command (CLCMD) is subsequently issued, the row address (RA') corresponding to the bank address (BA) is released from the latches and fed into de-scrambling logic 22 via bus 24, to be described in more detail in connection with FIG. 8.

For each memory bank, a group of the row address latches is provided. FIG. 8 shows an example for four memory banks. Each group might either store all row address bits or a subset thereof. A subset is sufficient, if the de-scrambling circuit 17' does not require all row address bits for its correct operation. For example, word line WL0 and word line WL1 in FIG. 5 have an identical data scrambling scheme. Therefore, it would not be necessary to store the address bit that distinguishes odd from even word lines.

In addition to the row address bit, the latches store word line repair information (REPAIR) separately for each bank, if correct de-scrambling of repaired DRAMs is required. A demultiplexer is used to control the storage operation. When an external word line activation is indicated by row command signal RCMD (i.e., Row Address Select (RAS)), the demultiplexer steers that signal to the group of latches which corresponds to the external bank address. That latch group than responds and stores the external row address (RA) and repair information (REPAIR), or a subset thereof.

Upon a column command indicated by the column command signal CLCMD (i.e., Column Address Select (CAS), a multiplexer feeds a row address (RA') to the de-scrambling logic 22 via bus 24, as described above. The row address (RA') on bus 24 is selected in accordance with the external bank address supplied during the column command CLCMD). The address logic 12' is equivalent to the address logic 12 described above. The address logic 12' feeds a data invert signal (DATAINV) on line 40 to both the write section 42 and the read section 44 of the data/inverter section. Also fed to the write section 42 is a conventional write enable signal (WRITE) and also fed to the read section 44 is a conventional read enable signal (READ).

Figure 9:
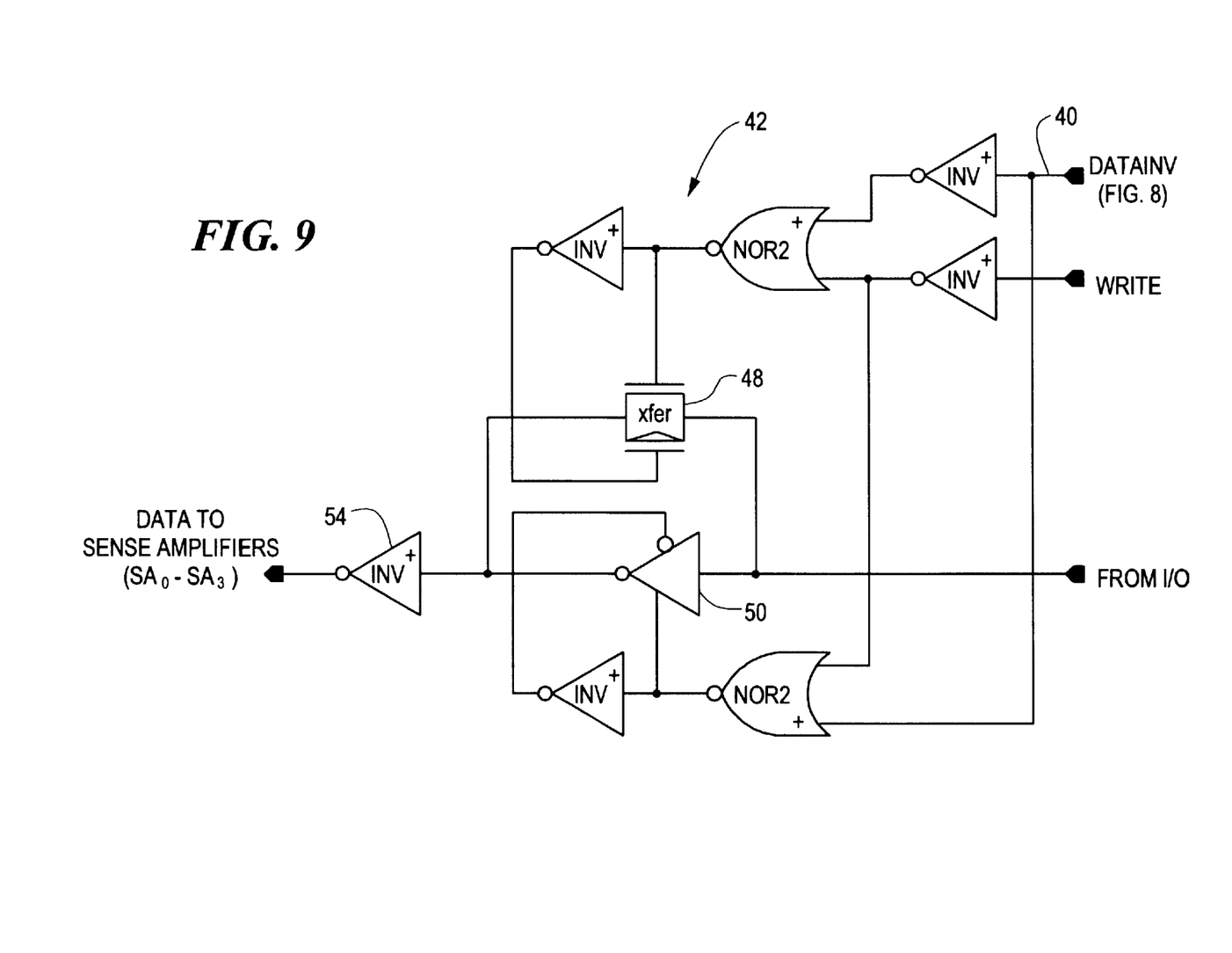
FIG. 9 is a schematic diagram of a read section used in the de-scrambling circuit of FIG. 8.

Referring to FIG. 9, the write section 42 is shown in more detail. If there is to be data written into the memory the logic signal WRITE is logic 1. If the data at the I/O is to be inverted, DATAINV is logic 1 and if the data on I/O is not to be inverted the logic signal on DATAINV is logic 0.

Under the condition where the data is not to be inverted, the logic signal WRITE is logic 1 and the logic signal DATAINV is logic 0. In response to such logic signals the tristate buffer 50 will invert the data from the I/O and such inverted data will be re-inverted by inverter 54 so that the data at the I/O appears non-inverted at the DATA line fed to the sense amplifiers. On the other hand, if the logic signal WRITE is logic 1 and the logic signal DATAINV is logic 1, the tristate buffer 50 is powered off and the data from the I/O passes through the transfer gate 48 and then through the inverter 54. Thus, the DATA line fed to the sense amplifier is the inversion of the data from the I/O.

Figure 10:
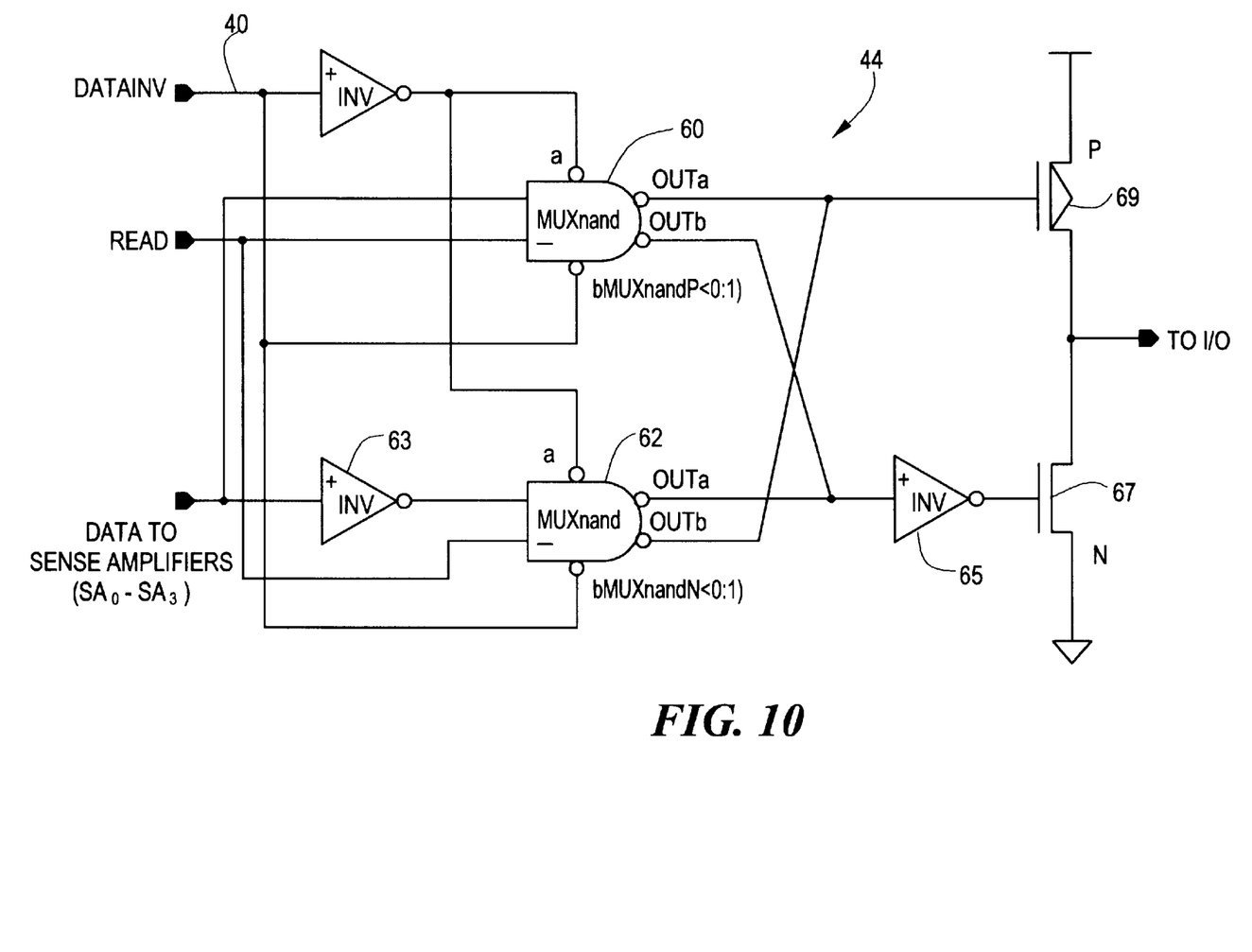
FIG. 10 is a schematic diagram of a write section used in the de-scrambling circuit of FIG. 8.

Referring to FIG. 10, read section 44 is shown in more detail. Data (DATA) read from the memory and passed to the sense amplifiers is passed either inverted or not inverted depending on the logic, state of the signal on DATAINV (on line 40) when the logic signal on READ is logic 1. If READ is logic 1 and if the DATAINV is logic 1 (high), the read data at the sense amplifier will appear inverted at the I/O line whereas if READ is logic 1 and the DATAINV line is logic 0 (low), the data at the I/O line will the data from the sense amplifier without any inversion. More particularly, when READ is logic 1 and DATAINV is logic 1, the input signal DATA is fed into the multiplexer NAND gate 60 which inverts signal DATA and passes it on to the inverter 65. Inverter 65 is controlling NFET 67. Therefore, signal DATA is inverted twice, by multiplexer NAND gate 60 and by inverter 65. If DATA is logic 1 the NFET 67 will be turned on and output signal I/O will be driven low, resulting in an inversion of signal DATA to signal I/O. Furthermore, when READ is logic 1 and DATAINV is logic 1, the input signal DATA is also inverted by inverter 63 and then fed into multiplexer NAND gate 62. Here it is inverted again, and passed onto the gate of PFET 69. In the case of a logic 0 signal on signal DATA, the gate of the PFET 69 will be driven low (logic 0), turning on the PFET, thus pulling the voltage on the I/O output signal high (logic 1), also resulting in an inversion of signal DATA to signal I/O.

On the other hand, when signal READ is logic 1 and DATAINV is logic 0, the input signal DATA is fed into the multiplexer NAND 60. Here, signal DATA gets inverted and passed onto the gate of PFET 69. If signal DATA is logic 1, the gate of PFET 69 will be driven low. This turns on the PFET 69 and drives the output voltage I/O high, resulting in a non-inverted transfer from signal DATA to signal I/O. Also, when signal DATA is logic 0, the inverter 63 will invert signal DATA and pass a logic 1 to multiplexer NAND 62. Multiplexer NAND 62 then passes a logic 0 to inverter 65 which sends a logic 1 onto the gate of NFET 67. This logic 1 turns on the NFET 67 and drives the output I/O low (logic 0). Consequently, signal data is passed without inversion onto signal I/O.

A number of embodiments of the invention have been described. Nevertheless, it will be understood that various modifications may be made without departing from the spirit and scope of the invention. Accordingly, other embodiments are within the scope of the following claims.

What is claimed is:

1. A memory, comprising:

an array of rows and columns of memory cells;

a plurality of sense amplifiers, each one having a true terminal and a compliment terminal;

a plurality of pairs of twisted bit lines, each one of the pairs of lines being coupled to true and compliment terminals of a corresponding one of the plurality of sense amplifiers;

a plurality of word lines each one being connected to a corresponding one of the rows of memory cells;

an address logic section coupled to column address signals fed to the bit lines and row address signals coupled to the word lines for producing invert/non-invert signals in accordance with the fed row and column address signals;

a plurality of inverters each one being coupled to a corresponding one of the sense amplifiers for inverting data fed to or read from the sense amplifier selectively in accordance with the invert/non-invert signals produced by the address logic; and wherein the array includes a redundant row of memory cells and wherein the logic section is fed by a signal indicating whether such redundant row of cells is used in the array.

2. A memory, comprising:

an array of rows and columns of memory cells;

a plurality of sense amplifiers, each one having a true terminal and a compliment terminal;

a plurality of pairs of bit lines, each one of the pairs of lines being coupled to a corresponding one of the plurality of sense amplifiers, one of bit lines in the pair being connected to the memory cells in a first one of the columns of such cells and the other one of the bits lines in the pair being connected to the memory cells in the second one of the columns of such memory cells, one of the lines in each pair of bit lines being coupled to the true terminal of the coupled one of the sense amplifiers and the other one of the lines of such pair of lines being coupled to the compliment terminal of the coupled one of the sense amplifiers;

a plurality of word lines each one being connected to a corresponding one of the rows of memory cells;

an address logic section fed by column address signals fed to the bit lines and row address signals coupled to the word lines for producing invert/non-invert signals in accordance with the fed row and column address signals;

a plurality of inverters each one being coupled to a corresponding one of the sense amplifiers for inverting data fed to or read from the sense amplifier selectively in accordance with the invert/non-invert signals produced by the address logic; and wherein the array includes a redundant row of memory cells and wherein the logic section is fed by a signal indicating whether such redundant row of cells is used in the array.

3. The memory recited in claim 2 wherein each one of the memory cells in one of the rows thereof is coupled to the true terminal of the plurality of sense amplifiers and each one the memory cells in another one of the rows thereof is coupled to the compliment terminal of the plurality of sense amplifiers.

4. The memory recited in claim 2 wherein one portion of the memory cells in one of the rows thereof is coupled to the true terminal of one of the plurality of sense amplifiers and another portion of the memory cells in such one of the rows thereof is coupled to the compliment terminal of another one of the plurality of sense amplifiers.

5. The memory recited in claim 4 wherein adjacent ones of the memory cells in such one of the rows are the true and compliment terminals of a corresponding pair of the sense amplifiers, respectively.

6. The memory recited in claim 2 wherein the address logic section is enabled in response to a test signal and wherein when such test signal is applied to the address logic the memory cells in the array are programed to bits of data having the same logic state.

7. The memory recited in claim 3 wherein the address logic section is enabled in response to a test signal and wherein when such test signal is applied to the address logic the memory cells in the array are programmed to bits of data having the same logic state.

\* \* \* \* \*

UNITED STATES PATENT AND TRADEMARK OFFICE
CERTIFICATE OF CORRECTION

PATENT NO.    : 6,570,794 B1
DATED         : May 27, 2003
INVENTOR(S)   : Hokenmaier et al.

It is certified that error appears in the above-identified patent and that said Letters Patent is hereby corrected as shown below:

Title page,
Item [73], Assignee, add -- International Business Machines Corporation, Armonk, NY --

Signed and Sealed this

Twenty-first Day of September, 2004

JON W. DUDAS
*Director of the United States Patent and Trademark Office*